United States Patent [19]
Lusby

[11] Patent Number: 5,162,729
[45] Date of Patent: Nov. 10, 1992

[54] EMBEDDED TESTING CIRCUIT AND METHOD FOR FABRICATING SAME

[75] Inventor: W. Randolph Lusby, Katy, Tex.

[73] Assignee: Compaq Computer Corporation, Houston, Tex.

[21] Appl. No.: 610,090

[22] Filed: Nov. 7, 1990

Related U.S. Application Data

[63] Continuation of Ser. No. 427,753, Oct. 26, 1989, Pat. No. 5,001,605.

[51] Int. Cl.$^5$ .............................................. G01R 31/02
[52] U.S. Cl. .............................. 324/158 R; 324/158 F
[58] Field of Search ................... 324/158 F, 537, 538, 324/691, 158 P, 158 R

[56] References Cited

U.S. PATENT DOCUMENTS

| | | |
|---|---|---|
| 3,546,775 | 12/1970 | Lalmond et al. . |
| 4,540,229 | 9/1985 | Madden ............................ 324/158 F |
| 4,795,670 | 1/1989 | Nishigaki et al. . |
| 4,800,461 | 1/1989 | Dixon et al. . |
| 4,812,792 | 3/1989 | Leibowitz . |
| 4,912,401 | 3/1990 | Nady, II et al. ................. 324/158 F |
| 4,961,053 | 10/1990 | Krug ................................ 324/158 R |
| 5,001,604 | 3/1991 | Lusby . |
| 5,008,614 | 4/1991 | Shreeve et al. .................. 324/158 F |
| 5,010,446 | 4/1991 | Scannell ........................... 324/158 F |

FOREIGN PATENT DOCUMENTS 0172132 2/1986 European Pat. Off. .

OTHER PUBLICATIONS

Herbert S. Dixon, *Rigid Flex: Where We've Been And Where We Are Going*, Apr. 23, 1989.
Herbert S. Dixon, *A New Generation of Flat Wire Packaging Techniques*, Sep. 28, 1966.
Rogers, *Lower Your System Costs with Flexible Circuitry*, 1977.
Rogers, *Innovators in Controlled Impedence Interconnections*, 1986.
Teledyne Report, *Flexible Printed Circuits: The Space Age Connection*, 3rd Quarter, 1982.
Teledyne Electro Mechanisms, *Rigid Flex*.
Teledyne Electro-Mechanisms, vol. 1, No. 3, *Regal Flex Design Upgrade*, 1989.
Electronic Packaging and Production Magazine, *Flexible Circuits Show Design Versatility*, pp. 32–25, Apr. 1989 Issue.

*Primary Examiner*—Ernest F. Karlsen
*Attorney, Agent, or Firm*—Pravel, Gambrell, Hewitt, Kimball & Krieger

[57] ABSTRACT

An improved structure for testing the operability of a completed circuit board having components thereon and improved method of fabricating same are disclosed. The structure and process include the use of an insulator portion with a printed circuit board adhered thereto which includes a testing pattern to evaluate the operability of a completed printed circuit board. The insulator portion which provides support for the test pattern extends past the edge of the printed circuit board thereby providing a remote means to test the operability of the printed circuit board without having to utilize valuable space and contact points on the printed board itself to test the operability of the completed printed circuit board once components have been installed.

2 Claims, 2 Drawing Sheets

EMBEDDED TESTING CIRCUIT AND METHOD FOR FABRICATING SAME

This is a continuation, of application Ser. No. 427,753 filed Oct. 26, 1989, issued as U.S. Pat. No. 5,001,605 on Mar. 19, 1991.

BACKGROUND OF THE INVENTION

1. Field of the Invention

The present invention relates to an improved structure for testing a completed printed circuit board and method for fabricating same. More particularly, the present invention includes an improved structure for testing the operability of a completed circuit board using an embedded test circuit which extends past the edge of the printed circuit board and includes connectors for easy attachment to a tester.

2. Description of the Prior Art

In the manufacture of printed circuit boards, it is necessary to test the operability of each board from time to time. Typically, printed circuit boards are tested during assembly and following final assembly. Testing during assembly is generally a simpler task since the printed circuit boards have fewer components, such as chips, installed which might interfere with the testing probes. However, after all the components have been installed, testing is more complicated. Frequently, the completed printed circuit board is saturated with components on both the top and bottom exterior surfaces thereby significantly inhibiting the attachment of any testing probe, particularly a remote probe which is lowered by a robotic device. The problems associated with testing are exacerbated as printed circuit boards become smaller and more surface mount chips are used, which may generate false satisfactory readings because the test probe may bring the chips into contact with the circuit board. The "real estate" on the surface of the printed circuit board has become a premium and allocation of designated space on the surface of the board for testing contact points has become more difficult to accommodate. Consequently, there is a need for a way to accommodate testing contact points to ensure the board's reliability; however, the availability of such space on the surface of a board is becoming more difficult to provide as the miniaturization of printed circuit boards continues.

SUMMARY OF THE INVENTION

Briefly, the invention is a simple and unique structure and method for fabricating same for testing the operability of a printed circuit board. A flexible circuit board which includes a test circuit is embedded within the rigid printed circuit board during its manufacture. The flexible board extends past the perimeter of the final main printed circuit board and contains the desirable test points for evaluating the operability of the working circuits The test circuit may contain its own conductor layer having a testing conductor pattern etched thereon or it may be a main conductor layer having a testing pattern etched thereon in addition to the working conductor patterns. By relocating the test points outside of the perimeter of the rigid printed circuit board, "real estate" for testing points on the surface of the printed circuit board is not required. Thus, the testing operation may be performed outside of the perimeter of the main circuit board, minimizing any interference which may otherwise have occurred with components or other parts of the surfaces of the main circuit board. Since the test points on the flexible circuit are spaced from the main printed circuit board, the circuits may be evaluated at any phase during the manufacturing process. Furthermore, the present invention may be used for maintenance purposes during the life of the printed circuit board. In some applications, it may be desirable to trim the flexible board off following initial testing.

Examples of the more important features of this invention have been summarized rather broadly in order that the detailed description may be better understood. There are, of course, additional features of the invention which will be described hereafter which will also form the subject of the claims appended hereto.

BRIEF DESCRIPTION OF THE DRAWINGS

In order that the features of this invention may be better understood, a detailed description of the invention, as illustrated in the attached drawings, follows.

DETAILED DESCRIPTION OF THE DRAWINGS

The manufacture of a combined multilayer rigid and flex printed circuit board is well known to those skilled in the art. The complete disclosure of U.S. Pat. No. 4,800,461 is hereby incorporated by reference and made a part of this application. U.S. Pat. No. 4,800,461 relates to an improved method for manufacturing a combined rigid and flex printed circuit board to avoid Z direction expansion.

Figure 1:
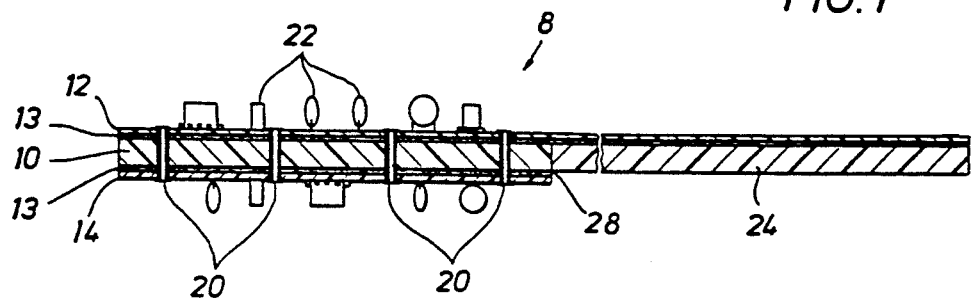
FIG. 1 is a cross-sectional elevation view of the present invention.
Figure 2:
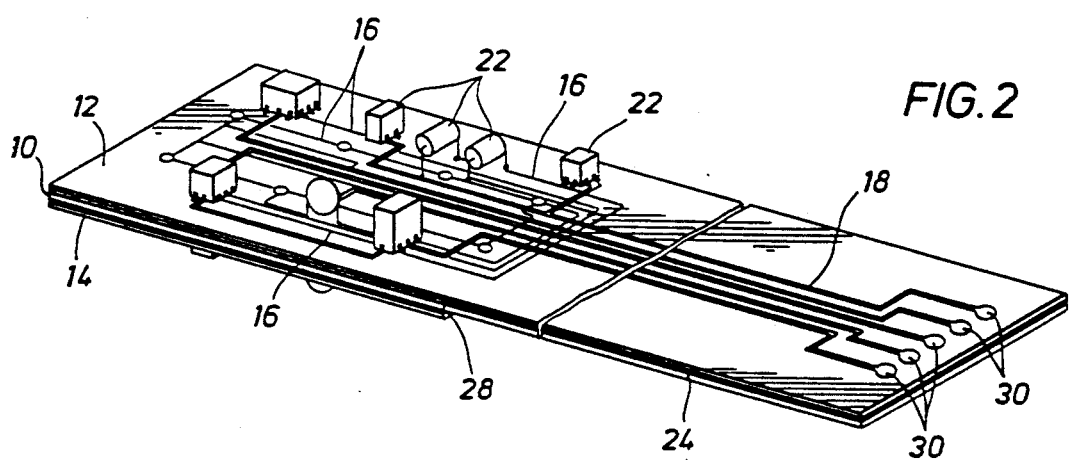
FIG. 2 is a perspective view of the present invention.

With reference to FIGS. 1 and 2, a printed circuit board 8 is shown having a rigid insulator 10, such as a prepregnated fiberglass sheet. The rigid insulator 10 supports conductor layers 12, 14 which are laminated by means of an adhesive layer 13 or other bonding material to the rigid insulator 10. A conductor pattern 16 is etched on each conductor layer 12 and 14. Conductor layer 12 also has a testing pattern 18 etched on it to evaluate the operability of the principal circuit patterns 16 of each conductor layer 12 and 14 and the various devices on the circuit board 8. The testing pattern 18 also serves to evaluate the operability of the overall printed circuit board 8. Vias 20 extend from the surface of each conductor pattern and transcend the rigid insulator 10. The vias serve to provide electrical connections between the conductor patterns etched respectively on conductor layers 12 and 14. Attached to the top surface of each conductor layer are electrical components 22 such as logic and memory chips, resistors and capacitors. A flexible insulator 24 is attached at one edge to the rigid insulator 10.

U.S. Pat. No. 4,800,461 discloses preferred materials to use in the manufacture of the rigid and flexible insulators and their method for attachment thereto. Typically, the flexible insulator would be manufactured of KAPTON which is a trademark of E. I. du Pont de Nemours & Company for polyimide film.

The conductor layer 12 is also adhered to one surface of the flexible insulator 24. The test pattern 18 extends past the edge of the rigid insulator 10 and continues onto the surface of the flexible insulator 24 past the edge 28 of the main printed circuit board 8. At a predetermined location past the edge of the circuit board and easily accessible during the manufacture and subsequent maintenance of the printed circuit board 8, are connection points or connectors 30. The connectors 30 are in electrical communication with the testing pattern 18 and permit the evaluation of the printed circuit board by contacting connectors 30 with remote probes or other robotic devices which test the quality of the board.

Figure 3A:
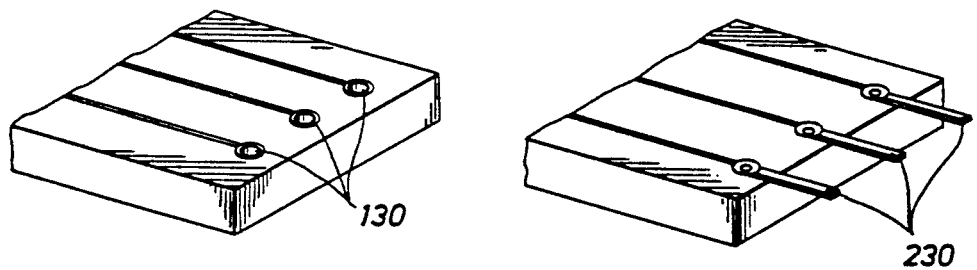
FIG. 3A and 3B are detailed perspective views of a portion of the present invention.
Figure 3B:
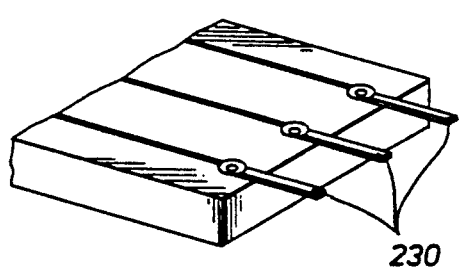

With reference to FIGS. 3A and 3B, alternate connectors 130 and 230 are illustrated. In FIGS. 1 and 2, the connectors as shown are copper test pads. In FIG. 3A, the connector 130 is a pre-drilled hole having a copper lining or other conductor lining. Alternatively, as shown in FIG. 3B, the connectors may be conductive probes or pins 230 which are attached to the testing conductor pattern.

Figure 4:
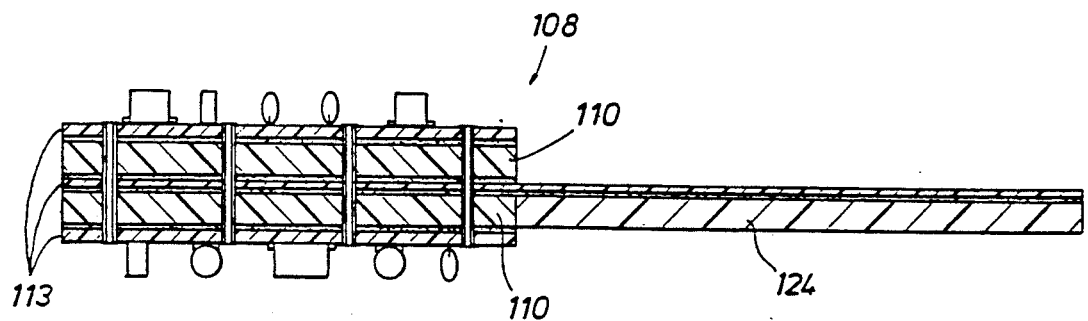
FIG. 4 is a cross-sectional elevation view of an alternate embodiment of the present invention.

Referring still to FIGS. 1 and 2 and now FIG. 4, the printed circuit board 8 may be layered in the manner shown in FIG. 4 permitting the continued stacking of rigid insulators 110 interspersed with conductor layers 113. In this manner, the printed circuit board 108 may be expanded to multiple layers, well known to those skilled in the art, with an flexible insulator 124 attached to an interior rigid insulator as disclosed above with respect to FIGS. 1 and 2. Since the insulator 124 is flexible, it may be bent easily to conserve space within the housing of the final assembled unit or may be removed entirely following the testing phases.

Figure 5:
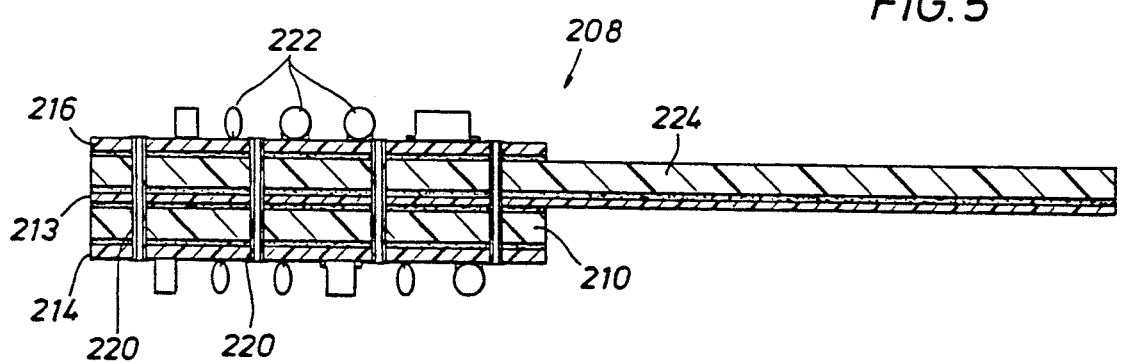
FIG. 5 is a cross-sectional elevation view of yet another alternate embodiment of the present invention.

With reference to FIG. 5, yet another alternate embodiment of the present invention is shown. In this embodiment, the flexible insulator 224 is assembled adjacent to a rigid insulator 210. As shown, the printed circuit board 208 includes the rigid insulator 210 having conductor layers 213 and 214 adhered to opposite sides thereto. The conductor layer 213 would include the testing pattern etched thereon as well. Flexible insulator 224 has conductor layer 213 adhered to one said and another conductor layer 216 adhered to the opposite side. Vias 220 electrically connect the conductor patterns etched on conductor layers 213, 214 and 216. The embodiment includes electrical components 222, such as memory chips, attached to the exposed surfaces of the printed circuit board 208. As noted above, this embodiment may include any number of additionally stacked layers of rigid insulators 210 in combination with conductor layers to form a multilayered rigid/flex circuit in accordance with this disclosure. The flexible insulator 224 is the embedded flexible circuit member since it may be connected to all or any portion of any working conductor pattern by means of the vias 220.

The present invention has been described in terms of particular embodiments. Obviously, modifications and alterations to these embodiments will be apparent to those skilled in the art in view of this disclosure. It is, therefore, intended that all such equivalents, modifications and variations fall within the spirit an scope of the present invention as claimed.

What is claimed is:

1. A method for testing the operability of a completed printed circuit board having components thereon, comprising the steps of:

providing an insulator having a rigid portion and a flexible portion with a first conductor layer adhered to one side of said rigid portion and a second conductor layer adhered to the other side of said rigid portion and one side of said flexible portion, wherein said first conductor layer includes a conductor pattern thereon and said second conductor layer includes a testing pattern thereon;

providing electrical contacts for connecting said conductor pattern and said testing pattern at predetermined locations and connectors attached to said testing pattern on said flexible portion;

contacting said connectors with a probe; and measuring a signal from said probe to determine the operability of said conductor pattern.

2. A method for testing the operability of a completed printed circuit board having components thereon, comprising the steps of:

providing a rigid insulator having a first conductor layer adhered to one side of said rigid insulator wherein said first conductor layer includes a conductor pattern thereon, and a second conductor layer adhered to the other side of said rigid insulator wherein said second conductor layer includes a testing pattern thereon;

providing a flexible insulator layer wherein a portion of said flexible insulator extends past said rigid insulator and one side of said flexible insulator layer adheres to the exposed side of said second conductor layer;

providing electrical contacts for connecting said conductor pattern and said testing pattern at predetermined locations and connectors attached to said testing pattern on said flexible insulator layer;

contacting said connectors attached to said testing pattern with a probe; and measuring a signal from said probe to determine the operability of said conductor pattern.

* * * * *

UNITED STATES PATENT AND TRADEMARK OFFICE
CERTIFICATE OF CORRECTION

PATENT NO.    : 5,162,729

DATED         : November 10, 1992

INVENTOR(S)   : W. Randolph Lusby

It is certified that error appears in the above-identified patent and that said Letters Patent is hereby corrected as shown below:

In col. 4, line 40, after "insulator" insert --layer--.

Signed and Sealed this

Fifth Day of October, 1993

Attest:

BRUCE LEHMAN

Attesting Officer

Commissioner of Patents and Trademarks